United States Patent [19]
Hanta

[11] Patent Number: 4,783,785
[45] Date of Patent: Nov. 8, 1988

[54] METHOD AND APPARATUS FOR DIAGNOSIS OF LOGICAL CIRCUITS

[75] Inventor: Nadateru Hanta, Kanagawa, Japan

[73] Assignee: Hitachi, Ltd., Tokyo, Japan

[21] Appl. No.: 381

[22] Filed: Jan. 5, 1987

[30] Foreign Application Priority Data

Jan. 7, 1986 [JP] Japan .................................. 61-1088

[51] Int. Cl.$^4$ ............................................ G01R 31/28
[52] U.S. Cl. .......................................... 371/25; 371/28
[58] Field of Search ....................... 371/25, 28, 15, 21

[56] References Cited
U.S. PATENT DOCUMENTS

| | | | |
|---|---|---|---|
| 3,541,441 | 11/1970 | Hrustich | 371/28 X |
| 3,633,174 | 1/1972 | Griffin | 371/28 |
| 4,093,851 | 6/1978 | Paulinski | 371/28 |
| 4,430,735 | 2/1984 | Catiller | 371/25 |
| 4,564,943 | 1/1986 | Collins et al. | 371/28 |
| 4,692,633 | 9/1987 | Ngai et al. | 371/25 X |

Primary Examiner—Charles E. Atkinson
Attorney, Agent, or Firm—Antonelli, Terry & Wands

[57] ABSTRACT

In a method and apparatus for diagnosis of a logical circuit including a combinational logical circuit or a semiconductor memory and having its input and output terminals respectively connected to input and output latches which are operated by the same clock pulse contained in a single-phase clock signal, diagnostic data is transferred to the diagnosed circuit through the input latches by the rise of one clock pulse in the clock signal, an output signal delivered out of the diagnosed circuit is latched into the output latch by the fall of the one clock pulse, and the latched data is compared with expected data to diagnose the logical circuit. Use of a clock signal containing clock pulses of a relatively large width can be permitted for diagnosing the logical circuit which is operating at a high operation speed.

6 Claims, 5 Drawing Sheets

METHOD AND APPARATUS FOR DIAGNOSIS OF LOGICAL CIRCUITS

BACKGROUND OF THE INVENTION

This invention generally relates to diagnostics of logical circuits and more particularly to a method and apparatus for diagnosis of a semiconductor memory and/or a combinational logical circuit having its input and output terminals respectively connected to latches which are operated by a single-phase clock signal.

A logical circuit having its input and output terminals respectively connected to latches operated by the same clock pulse contained in a single-phase clock signal is exemplarily constructed as illustrated in FIG. 1. Especially, in this example, an address latch (input latch) 2 and an output latch 3 of a semiconductor memory 1 are operated by a single-phase clock signal c. As an example, the clock signal c is illustrated in FIG. 2A. On the other hand, in the case where the circuit of FIG. 1 is operated using a multiphase clock signal, for example, a two-phase clock signal, respective clock terminals of the input and output latches 2 and 3 are separately supplied with two clock signals as shown at (1) and (2) in FIG. 2B. In the case of the multiphase clock signal, however, the width of clock pulses contained in one clock signal will often differ from that of clock pulses contained in another clock signal. Further, timing interval $T_0$ observed at receiving points of the clock signals is often different or deviates from that observed at supply points of the clock signals due to the fact that the paths through which clock signals are sent are rarely identical. For example, different logical circuits such as some gate circuits inserted in such paths cause different clock-pulse transmission delays, causing such difference in the timing interval. Accordingly, with a relatively short timing interval $T_0$, it is more advantageous to use the single-phase clock signal than to use the multiphase clock signal from the standpoint of the operating margin of logical circuits operated by clock pulses. Further, in designing logical circuits for use with a single-phase clock signal, the restriction of separate phase-component clock signals can advantageously be removed and the degree of freedom of design can be increased. Reference may be made to, for example, JP-A-58-83394 for a disclosure of techniques concerning a single-phase clock signal described above.

An exemplary method for diagnosis of the circuit of FIG. 1 operated by a single-phase clock signal is carried out in accordance with an operation timing chart as illustrated in FIG. 3. Successive sets of scan address input data $A_0$ to $A_7$, each set represented as N, N+1, N+2, ..., are applied to a data input terminal D of the address latch 2 at timings as illustrated in FIG. 3. A set of scan address input data $A_0$ to $A_7$ represented as the scan address N are set into the address latch 2 by the rise (i.e. leading edge) of a clock pulse P1 contained in the single-phase clock signal c applied in common to clock input terminals C of the address latch 2 and output latch 3 and are substantially at the same time applied to address input terminals $A_0'$ to $A_7'$ of the semiconductor memory 1 through an output terminal Q of the address latch 2. The scan address data N is held in the address latch 2 by the fall (i.e. trailing edge) of the clock pulse P1 and this data N, now in the address latch 2, is replaced with the next data N+1 at the rise of the following clock pulse as designated by P2. After expiration of a delay time Td of the semiconductor memory 1, output data D corresponding to the input data N is delivered to an output terminal $D_o$ of the semiconductor memory 1. At the rise of the clock pulse P2 following the clock pulse P1, the output latch 3 transfers the output data D of semiconductor memory 1, now being applied to a data input terminal D of the output latch 3, to an output terminal as an output signal $D_{out}$ through an output terminal Q of the output latch 3. The data D is held in the output latch 3 at the fall of the clock pulse P2 and this data D, now in the output latch 3, is replaced, at the rise of the following clock pulse P3, with data which is being applied to the output terminal $D_o$ of the semiconductor memory 1 and consequently to the input terminal D of the output latch 3 at the instant the clock pulse P3 rises. As will be seen from the above, concurrently with setting the scan address bits $A_0$ to $A_7$ into the address latch 2 and consequent accessing of the semiconductor memory 1 at the rise of one clock pulse contained in the clock signal c, the same clock pulse is applied to the output latch 3 to assure that data read out of the semiconductor memory 1 by a clock pulse which immediately precedes the one clock pulse which was used to access the semiconductor memory 1 can be set into the output latch 3. This operation is repeated at a period of T1 by sequentially changing the contents of the scan address bits $A_0$ to $A_7$. The data appearing at the output latch 3 is fetched by an external device such as a service processor in which it is compared with a predetermined expected value to examine normality of the operation of the semiconductor memory 1.

Incidentally, the operation speed of the semiconductor memory 1 has been increased more and more. Especially where the delay time between input terminals $A_0'$ to $A_7'$ to output terminal $D_o$ of the semiconductor memory 1 amounts to, for example, about 5 ns, in order to diagnose the limit of the operation speed with the circuit operable as illustrated in FIG. 3, the repetition period for the clock pulse in the clock signal c must be about 5 ns and diagnostic data must be sent to the address latch 2 at this rate. If the operation speed of the semiconductor memory 1 is further increased, the repetition period for the clock pulse in the clock signal c must further be decreased. However, a clock pulse signal containing clock pulses of a short width which occur at such a repetition period is difficult to generate, giving rise to incompatibility of the existing diagnostic apparatus with performance of the semiconductor memory. The same is true for diagnosis of other logical circuits than the semiconductor memory such as LSI logical modules.

Although JP-A- No. 59-90067 may be mentioned as describing that identical diagnostic data stored in a plurality of memories are picked up on a time sharing basis to obtain a high speed diagnostic pattern, it contains no disclosure of clock signals and therefore can not accommodate itself to a higher speed diagnostic pattern as desired.

SUMMARY OF THE INVENTION

An object of this invention is to provide method and apparatus for diagnosis of circuits, such as a semiconductor memory and/or a combinational logical circuit having its input and output terminals respectively connected to latches which are operated by the same clock pulse in a single-phase clock signal, the operational speed of which is only required to be about the same as those of the existing diagnostic apparatuses, but can readily provide an increased diagnostic speed, meeting the need for diangosing circuits having increased operational speeds.

According to this invention, input data for diagnosis is sent to a circuit to be diagnosed through input latches by the rise of a clock pulse contained in a single-phase clock signal, a signal delivered out of the diagnosed circuit is latched into an output latch by the fall of the same clock pulse, and data latched in the output latch is compared with expected data to complete diagnosis of the circuit. Thus, in contrast to the conventional method of FIG. 3 wherein for diagnosing normality of the operation of a circuit to be diagnosed at a certain rate, two pulses of a small width must be generated within a time interval equivalent to the certain rate, it is satisfactory for the present invention to generate a single pulse of a large width for the same purpose. A clock signal containing clock pulses of such a relatively large width can be generated relatively readily.

DESCRIPTION OF THE PREFERRED EMBODIMENTS

The invention will now be described by way of example with reference to the accompanying drawings.

Figure 4:
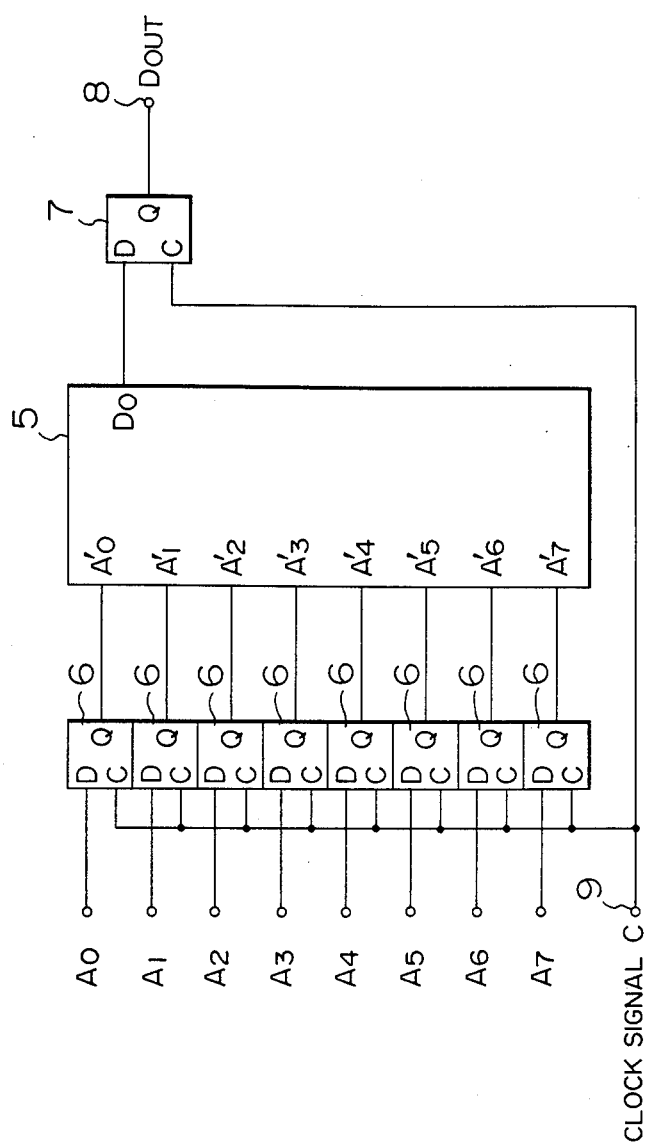
FIG. 4 is a schematic block diagram showing an exemplary logical circuit to be diagnosed to which a diagnostic method of the invention is applied.

Referring to FIG. 4 illustrating an exemplary circuit to which the invention is applied, a semiconductor memory 5 has address signal input terminals $A_0'$ to $A_7'$ which are respectively connected to output terminals Q of input latches 6. Scan address input data $A_0$ to $A_7$ denoted as N, N+1, . . . to input terminals D of the input latches 6 are supplied from an external device. Each of the data N, N+1 . . . must have sufficient duration for a normal semiconductor memory 5 to operate. An output terminal $D_o$ of the semiconductor memory 5 is connected to a data input terminal D of an output latch 7 whose output terminal Q is connected to an external output terminal 8 for delivery of an output signal $D_{out}$. Clock terminals C of each input latch 6 and the output latch 7 are connected in common to receive a single-phase clock signal c through an external clock terminal 9. The width of each clock pulse contained in the clock signal c is shorter than the duration of each of the data N, N+1, . . .

Figure 5:
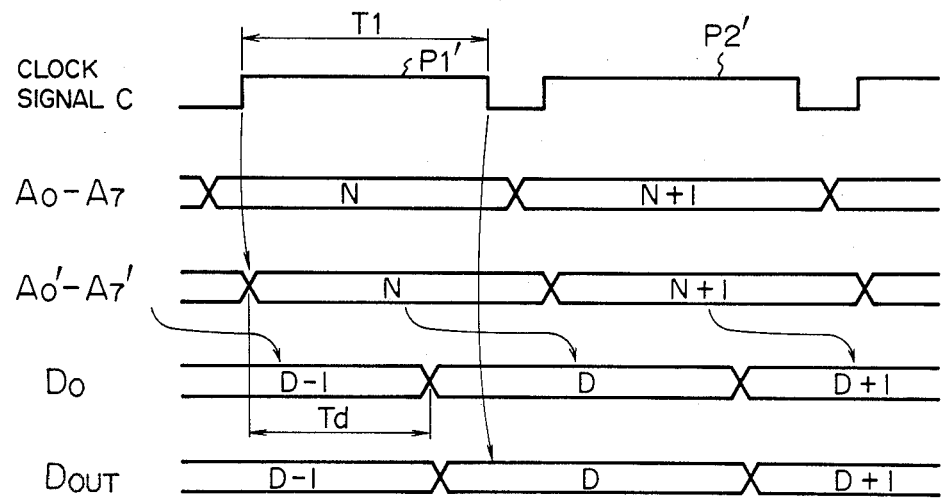
FIG. 5 is a timing chart useful in explaining an embodiment of the diagnostic method of the invention.

The FIG. 4 circuit is operated according to a diagnostic method as illustrated in a timing chart of FIG. 5. More particularly, when the input latches 6 are operated by the rise of a clock pulse P1', input data N applied to the data input terminals D of the input latches 6 is transmitted to the input terminals $A_0'$ to $A_7'$ of the semiconductor memory 5. After expiration of an operation delay time Td, data D corresponding to the input data N is delivered to the output terminal $D_o$ of the semiconductor memory 5. Because the rise of the clock pulse P1' has already placed the output latch 3 into a transfer enabling mode for transferring the applied signal at its input terminal D to its output terminal Q, this data D is delivered out of the output terminal Q of the output latch 3 as soon as it is applied to the input terminal D of the output latch 3, and is latched by the fall of the clock pulse P1'. Thus, the transfer of the data input signal from input terminal to output terminal of the input latches 6 and the transfer of the data input signal from input terminal to output terminal of the output latch 7 are both initiated by the rise of a clock pulse in the clock signal c, and the data input signal at the input and output latches 6 and 7 are held by the fall of the same clock pulse. Then, the output data latched at the output latch 7 is compared with expected data.

Figure 1:
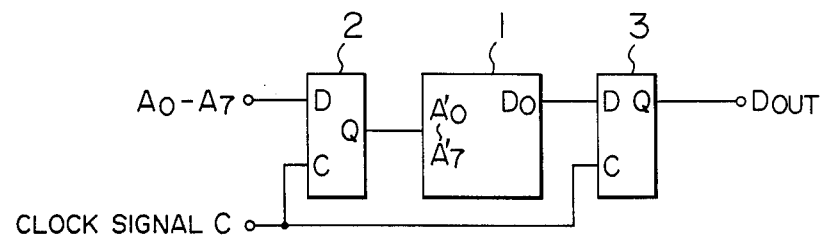
FIG. 1 is a schematic block diagram showing a logical circuit to be diagnosed.
Figure 2A:
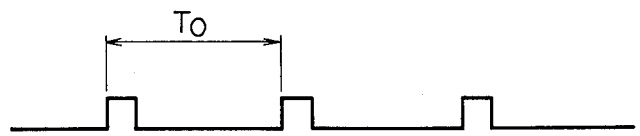
FIG. 2A is a waveform diagram of a single-phase clock signal used for operating the circuit of FIG. 1.
Figure 2B:
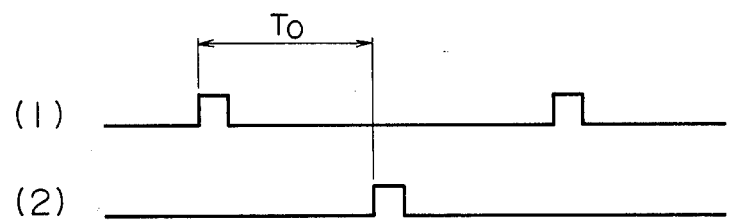
FIG. 2B is a waveform diagram showing a multiphase clock signal used for operating the FIG. 1 circuit.
Figure 3:
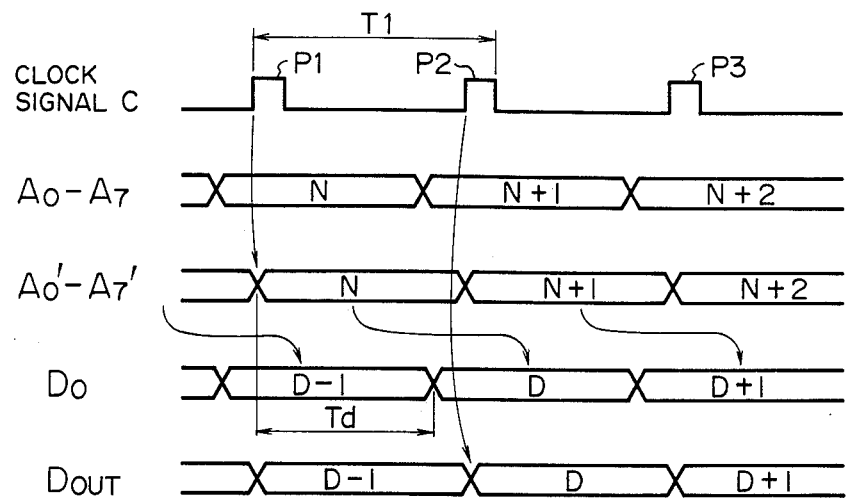
FIG. 3 is a timing chart useful in explaining the operation of the FIG. 1 circuit with the single-phase clock signal of FIG. 2A.

As described previously, in order to diagnose the limit of the operation speed of semiconductor memory 1 according to the conventional method of FIG. 3, the repetition period for the clock pulse in the clock signal c must be decreased. According to the present invention, however, the scan address bits $A_0$ to $A_7$ are transferred to the input terminals $A_0'$ to $A_7'$ of the semiconductor memory 5 through the input latches 6 by the rise of a clock pulse in the clock signal c, the clock pulse is caused to fall when data at the output terminal $D_o$ of semiconductor memory 5 is delivered to the output latch 7 after expiration of the time interval T1, and it is examined whether normal data is held in the output latch 7 by the fall of the clock pulse to thereby diagnose with ease whether the semiconductor memory 5 can be operated at an operation speed corresponding to T1. By changing the time interval T1 gradually, the limit of the operation speed of semiconductor memory 5 can readily be examined.

Figure 6:
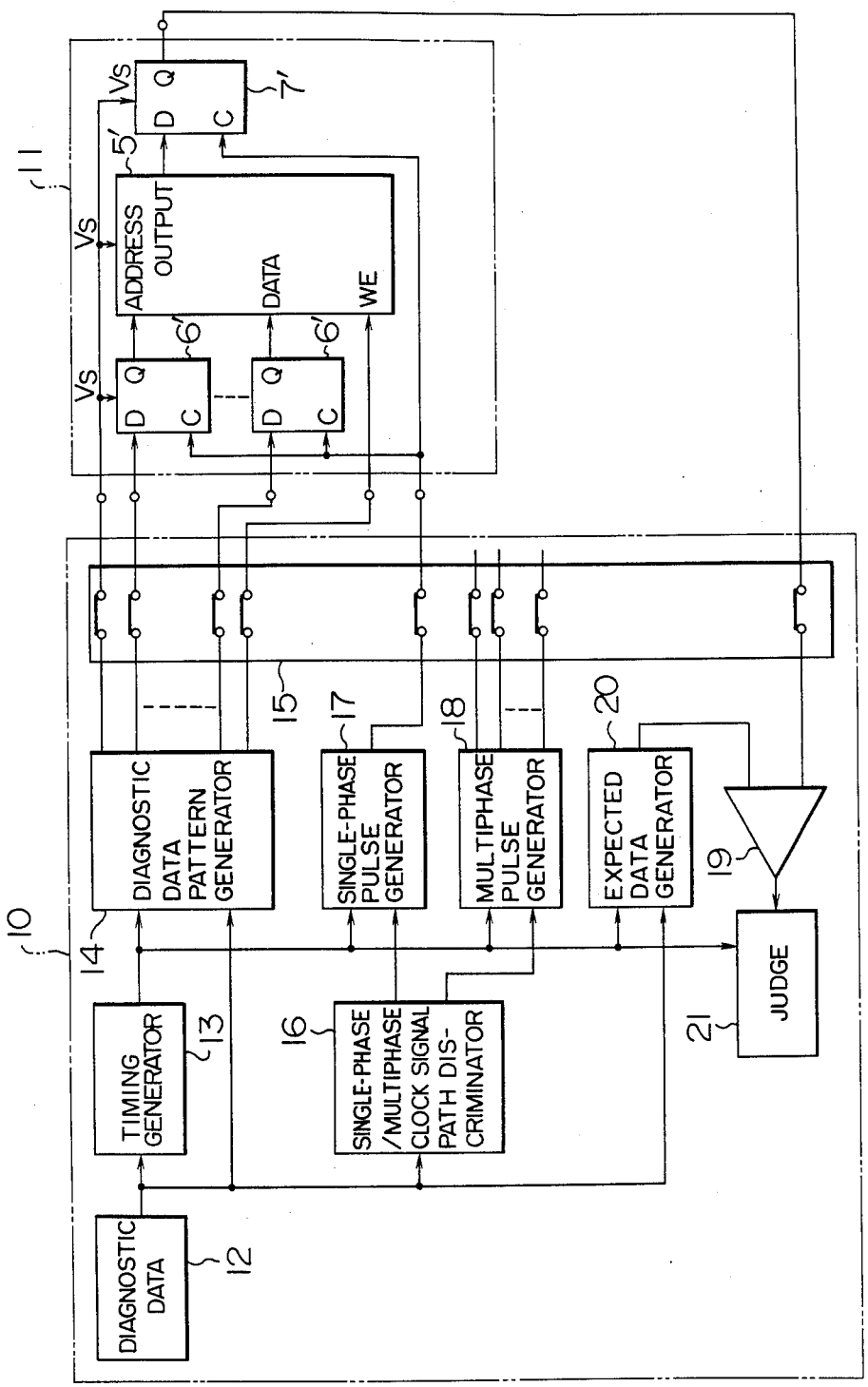
FIG. 6 is a block diagram of a diagnostic apparatus according to an embodiment of the invention.
Figure 7:
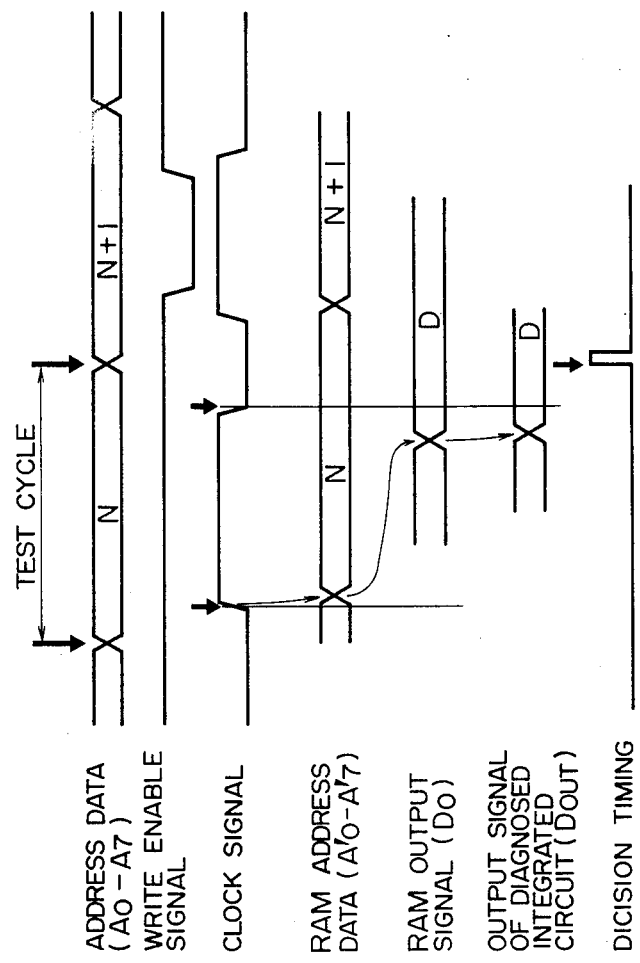
FIG. 7 is a timing chart useful in explaining the diagnostic apparatus of FIG. 6.

Turning to FIG. 6, there is illustrated, in block form, a diagnostic apparatus according to an embodiment of the invention. FIG. 7 is a timing chart useful for explaining the operation of the FIG. 6 apparatus. The diagnostic apparatus will be described with reference to FIGS. 6 and 7.

In FIG. 6, a diagnostic apparatus 10 is connected with a large scale integrated circuit 11 to be diagnosed, like the circuit of FIG. 4, which is comprised of input latches 6', a semiconductor memory 5' and an output latch 7' and operated by a single-phase clock signal. This circuit will hereinafter be referred to as an LSI.

The diagnostic apparatus is operated on the basis of diagnostic data. The diagnostic data has been stored in, for example, a floppy disc and upon diagnosis, it is loaded into a memory included in a controller (not shown) of the diagnostic apparatus. This diagnostic data is representative of information necessary for various tests of the LSI to be diagnosed. For example, the diagnostic data contains a power supply voltage Vs of the diagnosed LSI, information concerning input/output signal voltage levels, information concerning waveform and polarity of data signal to the diagnosed LSI, information necessary for discriminating whether the clock signal path of the diagnosed LSI is for the single-phase clock signal or for the multiphase clock signal, test pattern information and so on. Especially, information for determining various timings in diagnosis as indicated at thick arrows in FIG. 7 is also included in the diagnostic data. FIG. 7 shows that timings are to be determined for designating a test cycle and sequentially supplying address data N, N+1, ... to the diagnosed LSI as the test cycle proceeds, for defining rise and fall of individual clock pulses in the clock signal c, and for deciding a result of comparison between output signal of the output latch and expected value data (to be described later). A timing generator 13 generates, on the basis of the timing information contained in the diagnostic data, timing signals representative of a multiplicity of timings. A diagnostic data pattern generator 14 connected to receive the timing signals and the diagnostic data synthesizes the diagnostic data and the timing signals to generate signals representative of a test pattern. The test pattern signals are transmitted to the diagnosed LSI 11 through a switch matrix 15. Included in the signals representative of the test pattern is a signal representative of the decision timing shown in FIG. 7.

A single-phase/multiphase clock signal path discriminator 16 connected to receive the diagnostic data is subject to the information for discrimination between single-phase and multiphase clock signal paths contained in the diagnostic data to select either a single-phase pulse generator 17 in the presence of a single-phase clock signal path or a multiphase pulse generator 18 in the presence of a multiphase clock signal path. The single-phase pulse generator 17 and multiphase pulse generator 18 are both connected to outputs of the single-phase/multiphase clock signal path discriminator 16 and timing generator 13 to generate, on the basis of the timing signals produced from the timing generator, either the single-phase clock signal or the multiphase clock signal. The single-phase pulse generator 17 is set such that, as explained previously, the clock signal generated therefrom contains clock pulses having a larger pulse width than that of clock pulses contained in the clock signal c shown in FIG. 3. The output signals of the single-phase and multiphase pulse generators 17 and 18 are also supplied to the diagnosed LSI 11 through the switch matrix 15. An output signal of the diagnosed LSI 11 is applied through the switch matrix 15 to a comparator 19 at which it is compared with expected data supplied from an expected data generator 20, and a result of comparison is decided by a judge 21 connected to the output of the comparator 19. For the purpose of diagnosing various LSI's having different terminal arrangements, the switch matrix 15 is adapted to change the connection of input/output signals in compliance with the type of an LSI to be diagnosed.

The semiconductor memories of FIGS. 4 and 6 are for illustration purpose only and may be replaced with combinational logical circuits for their diagnosis in a similar manner.

As has been described, according to the present invention, a method and apparatus are provided for diagnosis of circuits, such as the semiconductor memory and/or the combinational logical circuit having its input and output terminals respectively connected to latches which are operated by the same clock pulse in a single-phase clock signal, the operational speed of which is only required to be about the same as those of the existing diagnostic apparatuses, but can readily provide an increased diagnostic speed, meeting the need for diagnosing circuits having increased operational speeds.

I claim:

1. A method for diagnosing a logical circuit having its input and output terminals respectively connected to input and output latches which are operated by the same clock pulse by applying test signals representative of a diagnostic data pattern to said logical circuit, comprising the steps of:

applying said test signals to the input terminals of said logical circuit for a predetermined time interval which is sufficient for said logical circuit to operate when it is normal;

applying one clock pulse of a desired pulse width which is shorter than said predetermined time interval to clock input terminals of said input latches and a clock input terminal of said output latch after an instant that said test signal are applied, so that said test signals are transferred to said logical circuit through said input latches by a first edge of said one clock pulse and an output signal from said logical circuit is latched in said output latch by a second edge of said one clock pulse; and comparing, after said one clock pulse expires, an output signal of said output latch with expected data obtained when the operation of said logical circuit is normal to thereby diagnose said logical circuit.

2. A diagnostic method according to claim 1 wherein the maximum operation speed of said logical circuit is decided by gradually changing said desired pulse width of said one clock pulse.

3. A diagnostic method according to claim 1 wherein said logical circuit comprises an integrated circuit including a semiconductor memory.

4. An apparatus for diagnosing a logical circuit having its input and output terminals respectively connected to input and output latches which are operated by the same clock pulse, said apparatus comprising:

means for providing diagnostic data containing information necessary for performing diagnosis;

timing control means, responsive to said diagnostic data providing means, for controlling timings for said clock pulse and test signals representative of a diagnostic data pattern;

means, responsive to said diagnostic data providing means and said timing controlling means, for generating said test signals representative of a diagnostic data pattern corresponding to said diagnostic data for a time interval which is sufficient for said logical circuit to operate when it is normal;

means, responsive to said timing controlling means, for generating said clock pulse for a desired time interval after an instant that said test signals are applied to said logical circuit;

means, responsive to said timing controlling means and said diagnostic data providing means, for generating expected data representative of data delivered out of said logical circuit when the operation of said logical circuit is normal; and diagnostic means for comparing an output signal of said logical circuit with said expected data to diagnose said logical circuit, said timing controlling means causing said diagnostic means to operate after said clock pulse expires, wherein said input latches are operated by a first edge of said clock pulse to transfer said test signals to said logical circuit, said output latch is operated by a second edge of said clock pulse to latch the ottput signal from said logical circuit, and the latched output signal of said logical circuit is examined by said diagnostic means.

5. A diagnostic apparatus according to claim 4 wherein said logical circuit comprises a semiconductor memory.

6. A diagnostic apparatus according to claim 4 wherein said input latches, said output latch and said logical circuit are formed into a single integrated circuit.

* * * * *